US010871532B2

(12) United States Patent
Popescu

(10) Patent No.: US 10,871,532 B2
(45) Date of Patent: Dec. 22, 2020

(54) LOCAL COIL MATRIX AND METHODS FOR IMAGE ACQUISITION

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/362,934

(22) Filed: Mar. 25, 2019

(65) Prior Publication Data

US 2019/0293738 A1 Sep. 26, 2019

(30) Foreign Application Priority Data

Mar. 26, 2018 (EP) .................................... 18164019

(51) Int. Cl.
*G01V 3/00* (2006.01)
*G01R 33/3415* (2006.01)
*G01R 33/54* (2006.01)
*G01R 33/36* (2006.01)

(52) U.S. Cl.
CPC ..... *G01R 33/3415* (2013.01); *G01R 33/3664* (2013.01); *G01R 33/543* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| 4,665,368 A * | 5/1987 | Sugiyama ........ G01R 33/34053 324/309 |
| 4,924,868 A | 5/1990 | Krause |
| 8,072,211 B2 * | 12/2011 | Harvey .............. G01R 33/5659 324/309 |
| 2003/0076274 A1 * | 4/2003 | Phelan ..................... H01Q 3/26 343/895 |
| 2003/0164704 A1 | 9/2003 | Yoshida |
| 2005/0134271 A1 | 6/2005 | Zheng et al. |
| 2007/0038068 A1 | 2/2007 | Leussler |
| 2008/0129296 A1 | 6/2008 | Fischer |
| 2009/0256565 A1 * | 10/2009 | Marinelli ............. G01R 33/561 324/309 |

(Continued)

FOREIGN PATENT DOCUMENTS

| DE | 10308961 A1 | 9/2003 |
| DE | 102006055136A1 A1 | 5/2008 |
| EP | 0280908 A1 | 9/1988 |

OTHER PUBLICATIONS

European Search Report for European Patent Application No. 18164019.4-1022 dated Oct. 2, 2018.

*Primary Examiner* — Walter L Lindsay, Jr.
(74) *Attorney, Agent, or Firm* — Lempia Summerfield Katz LLC

(57) ABSTRACT

A local coil matrix and a method are provided for image acquisition with a magnetic resonance tomography unit. The local coil matrix includes a plurality of coil windings. In magnetic resonance imaging, a predetermined region of a patient arranged in the vicinity of the local coil with selectable differently-sized sensitivity ranges is acquired and/or excited. An image is reconstructed from the magnetic resonance signals acquired with the local coil matrix.

14 Claims, 9 Drawing Sheets

(56) References Cited

U.S. PATENT DOCUMENTS

| | | | |
|---|---|---|---|
| 2010/0174348 A1* | 7/2010 | Bulkes | A61N 1/05 607/116 |
| 2012/0119739 A1* | 5/2012 | Gleich | G01R 33/381 324/309 |
| 2012/0150458 A1* | 6/2012 | Sodickson | G01R 33/1215 702/57 |
| 2013/0229176 A1* | 9/2013 | Fautz | G01R 33/246 324/307 |
| 2015/0323624 A1 | 11/2015 | Feinberg | |

* cited by examiner

FIG 7
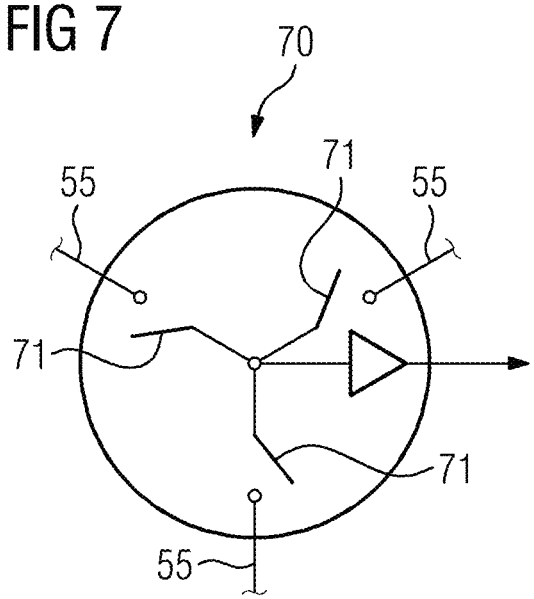
FIG 8
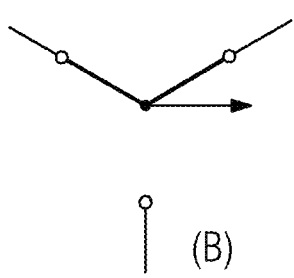
(B)
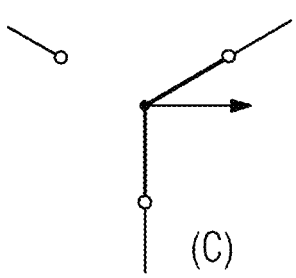
(C)
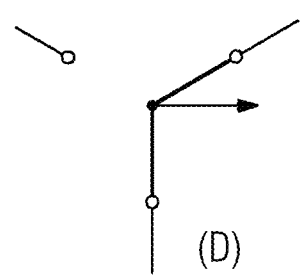
(D)
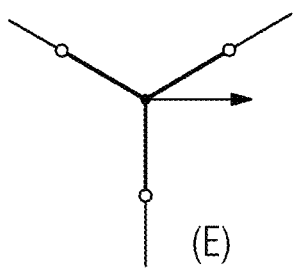
(E)
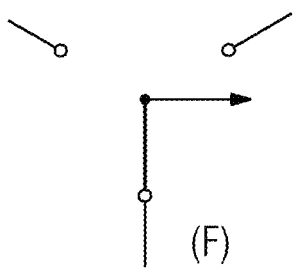
(F)
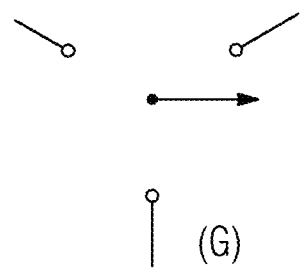
(G)

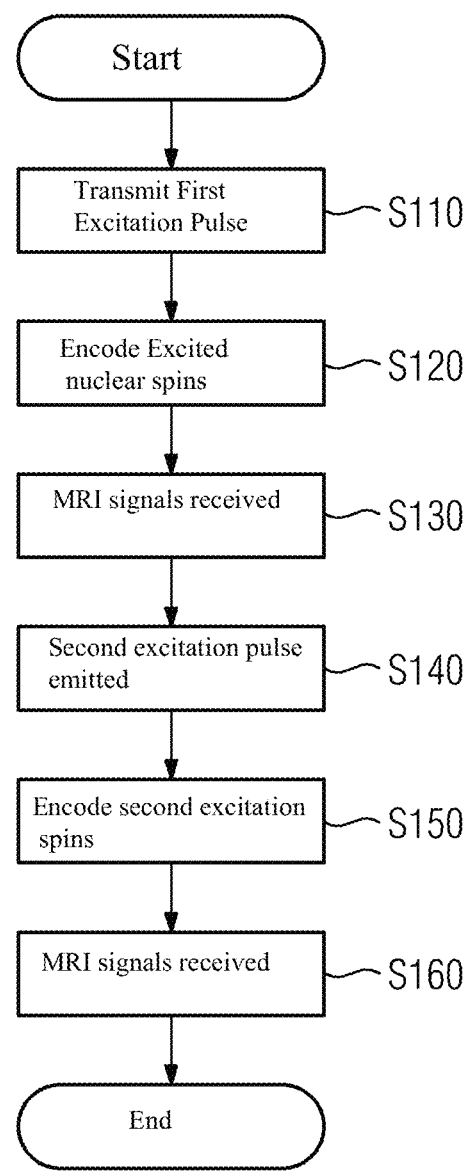

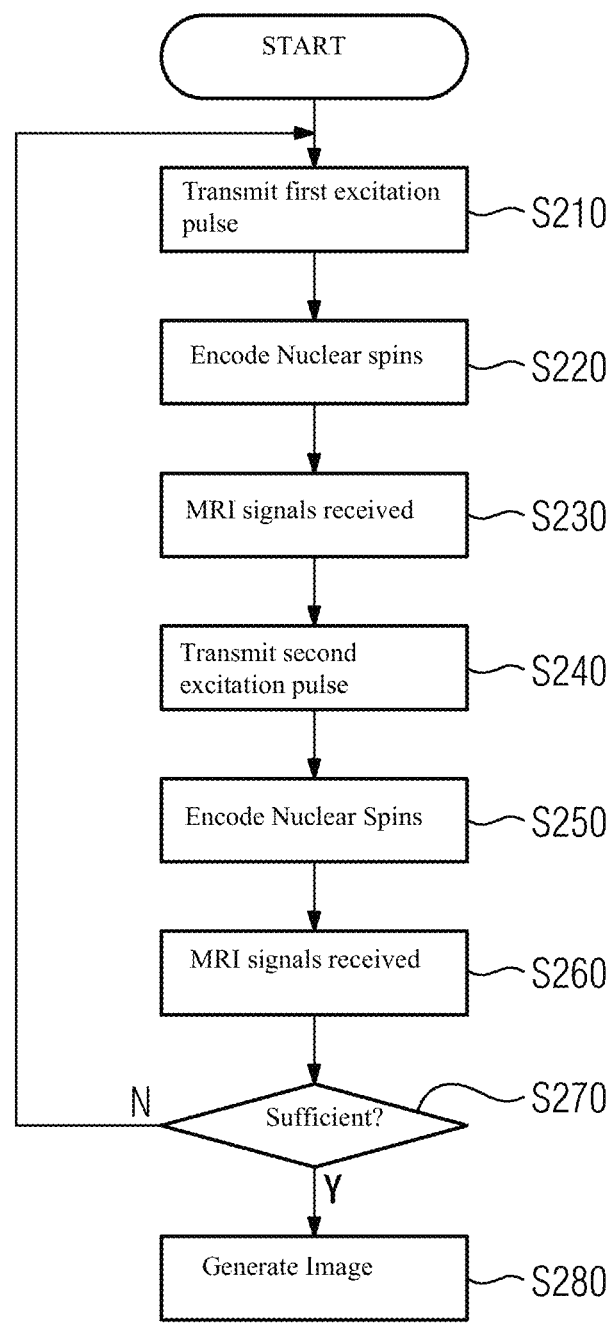

LOCAL COIL MATRIX AND METHODS FOR IMAGE ACQUISITION

CROSS REFERENCE TO RELATED APPLICATIONS

This application claims the benefit of EP18164019.4, filed on Mar. 26, 2018, which is hereby incorporated by reference in its entirety.

FIELD

Embodiments relate to a local coil matrix for a magnetic resonance measurement and methods for image acquisition with the local coil matrix.

BACKGROUND

Magnetic resonance tomography units are imaging apparatuses that, in order to image an examination object, align nuclear spins of the examination object with a strong external magnetic field and excite them to precess about the alignment by an alternating magnetic field. The precession or return of the spins from the excited state to a state with a lower energy in turn generates an alternating magnetic field, also called a magnetic resonance signal, as a response that is received via antennas.

With the aid of magnetic gradient fields, the signals are impressed with spatial encoding that subsequently provides an assignment of the received signal to a volume element. The received signal is then evaluated, and a three-dimensional imaging depiction of the examination object is provided. The depiction generated depicts a spatial density distribution of the spins.

The magnetic resonance signals from the body of the patient originate from regions with different conditions. While some regions are largely homogeneous, for example fatty tissue and large muscles, such as in the thigh, other regions such as the wrist or coronary vessels are finely structured and include tissue with different properties. This gives rise to different requirements with respect to the homogeneous excitation of the nuclear spins and where adaptation and optimization of the acquisition and evaluation of the magnetic resonance signals are also conceivable.

SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a local coil and a method for image acquisition for better and more efficient image acquisition.

The local coil matrix includes a plurality of coil windings. Coil windings are antenna coils configured to acquire radio-frequency alternating magnetic fields, for example, generated by nuclear spins, to convert them into electric signals for image acquisition or to emit them for the excitation of nuclear spins. In the case of transmission, the coil winding may be passively excited by an externally generated radio-frequency alternating magnetic field. The coil winding may include one or more windings. The local coil matrix is configured to be able, in the case of magnetic resonance imaging, to acquire a predetermined region of a patient arranged in the vicinity of the local coil with selectable differently-sized sensitivity ranges. 'Sensitivity range' denotes the range in the space in which the coil winding only has a slight decrease in the voltage or current induced by an alternating magnetic field relative to a magnetic field source in the center of an area enclosed by the coil winding. The number of windings or different preamplifier sensitivities (amplitude and phase), that are independent of the geometry or shape of the coil, may be calculated from the sensitivity of the respective coil. A slight decrease may be an attenuation of less than 6 dB, 12 dB, 18 dB or 24 dB. Coil windings with different dimensions, for example, enclosed areas, may be configured to receive the magnetic fields.

The local coil matrix provides the detection of an alternating magnetic field with different selectable sensitivity ranges and thus the acceleration or improvement of image acquisition with the methods described below.

In an embodiment of the local coil matrix, the local coil matrix includes a first coil winding and a second coil winding. The first coil winding includes a first sensitivity range and the second coil winding includes a second sensitivity range. The different sensitivity ranges may, for example, be defined by different geometries, such as different diameters or circumference of the coil windings. The first sensitivity range is a subset of the second sensitivity range. The range of equal sensitivity to an alternating magnetic field of the first coil winding is smaller than that of the second coil winding and substantially retained therein. This may, for example, be the case when the first coil winding encloses a smaller area than the second coil winding.

In addition, the coil windings must be suitably arranged with respect to one another, for example when the coil windings are arranged co-planarly in adjacent planes, such that the projection along the surface normals of the second coil winding onto the first coil winding includes, i.e. substantially completely covers, this. Adjacent may be considered to be a distance of less than 0.1 times, 0.2 times or 0.5 times the diameter or the largest dimension of the first coil winding. However, it is also possible that, for example for decoupling adjacent first coils, an overlap is provided, that is then not covered by the projection of the area of the second coil, as the use of the term "substantially" is intended to indicate.

Several size classes of coil windings may be cascaded so that a further class of coil windings is provided between the first coil windings and the second coil windings that covers larger dimensions than the first coil windings and is the same ratio as the second coil windings, while the further class of coil windings is in turn smaller than the second coil windings, is included in the sensitivity range and is the same ratio to the second coil windings as the first coil windings.

Since the local coil matrix includes the area to be acquired with coil windings of a different size, it is a possible, without changing the local coil matrix, to select a coil winding with the most suitable size of sensitivity range for the examination and thus to optimize the image quality.

In an embodiment of the local coil matrix, the local coil matrix includes a plurality of first coil windings. The individual first coil windings in each case include first sensitivity ranges. The first coil windings may be arranged in a co-planar manner in an area in a grid or matrix. The matrix or the grid may also be only partially occupied so that there are gaps between the sensitivity ranges of the first coil windings. A second coil winding may then be arranged in a substantially parallel plane at a short distance, for example shorter than the diameter of the first coil windings, such that the projections of the first coil windings onto the second coil winding at least partially cover the area enclosed by the second coil winding. At least in a region in the vicinity of the first coil windings, that is defined by the sensitivity range thereof, for example the depth thereof perpendicular to the area enclosed by the first coil winding, the first coil windings partially cover the image acquisition range of the second coil winding. For example, in a matrix arrangement, it is possible that only every second grid point is occupied by a first coil winding or another, even irregular arrangement, may be provided so that the projections of the sensitivity ranges of the first coil windings onto the area of the second coil winding cover the area thereof by more than 20%, 50% or 80%.

The local coil matrix with subsampling with different resolutions, such as is described in the following in respect of the methods, provides a magnetic resonance depiction of a patient to be acquired more quickly.

In an embodiment of the local coil matrix, the local coil matrix includes a plurality of second coil windings. The plurality of second coil windings form a matrix or a grid, that, with the areas enclosed by the second coil windings, substantially covers a two-dimensional examination region, i.e. apart from gaps, that are smaller than 20%, 10% or 5% of the enclosed area. First coil windings are provided with a sensitivity range that is a subset of the sensitivity range of the respective second coil winding. The areas enclosed by the second local coils may overlap or be disjoint.

By a plurality of second local coil windings, the local coil matrix provides the acquisition of larger regions of the patient during an examination.

In an embodiment of the local coil matrix, the local coil matrix includes a controller and the first coil windings include detuning elements in signal connection with the controller. For example, PIN diodes or switching elements in conjunction with capacitors or inductors may be provided with which a first coil winding may be brought by the controller from a state with resonance at the Larmor frequency of the magnetic resonance tomography unit into a non-resonant state. A non-resonant state is considered to be a state in which, with the same applied B1 field with the Larmor frequency, the first coil winding includes an amplitude of an induced current or voltage that is more than 12 dB, 24 dB, 40 dB or 60 dB lower than an induced voltage with the same B1 field in resonant state. The detuning, for example with the PIN diode, may take place in multiple stages or continuously between the states.

Switching the first coil windings into the resonant and non-resonant state or continuous detuning provides the first coil windings to be used as resonance elements in the excitation of the nuclear spins in order, depending upon the phase, to amplify or attenuate the B1 field selectively at different locations and thus perform B1 shimming of the field distribution of the excitation pulse for the homogenization of the excitation. The setting may be adapted individually for each excitation pulse and in this way, for example, the SAR load may be reduced.

In an embodiment of the local coil matrix, the local coil matrix includes a coupling element or a plurality of coupling elements and a controller. Coupling elements are switching elements, that, due to a control signal of the controller applied via a signal connection between the controller and coupling element, are able to establish and/or open one or more electrical connections. An electrical connection via the coupling element is a connection with which a radio-frequency signal with the Larmor frequency of an imaging magnetic resonance tomography unit undergoes attenuation of less than 3 dB, 6 dB or 12 dB. The electrical connection is achieved if, when passing through the open coupling element, the radio-frequency signal is attenuated by more than 18 dB, 24 dB, 36 dB or 60 dB. Coupling elements may, for example, be implemented by relays, micromechanical switches, PIN diodes or transistors. Combinations of a plurality of switching elements to form a coupling element, for example, may be used to provide one connection to be closed and simultaneously another to be opened or in order to provide a plurality of connections simultaneously.

The coupling element or coupling elements are in signal connection with at least two segments of a coil winding and the controller is configured to connect or disconnect the at least two coil segments with the aid of the coupling element or coupling elements. By activating a first switching state of a coupling element, a coil winding is formed so that a closed electrical connection for a radio-frequency signal with the Larmor frequency is formed between two adjacent connection points around an enclosed area so that an alternating magnetic field with the Larmor frequency through the area induces a magnetic resonance signal at the connection points or, vice versa, supplying a transmission signal to the connection points generates an alternating magnetic field through the enclosed area. Such a coil winding may only include one winding since then the coupling element only has to establish a connection between the coil segments. However, a plurality of windings with more complex coupling elements may also be used. The activation of a second switching state by the controller, for example, provides an electrical connection to be again released or opened. Depending upon the interconnection of the coupling elements and the coil segments, the first and second switching states may, for example, be the open or closed state or even an alternation between two electrical connections.

The local coil matrix provides for the coupling elements to switch different coil windings from the coil segments variably and thus to adapt the sensitivity ranges flexibly for the optimization of the image acquisition. For example, the coupling elements are able to provide different patterns in a flexible manner at the first and second coil windings so that the first and second coil windings may be sampled more efficiently with the methods described below with subsampling or "compressed sensing". Additionally, during the excitation pulse, as resonant elements, the coil windings formed by interconnection of the coupling elements and coil segments provide B1 shimming. The configurable coil windings may be used as transmitting antennas so that, with subsampling, the nuclear spins are only excited in the subregions to be acquired and not in the entire region to be imaged, thus reducing the global SAR load in the entire body.

In an embodiment of the local coil matrix, the coil segment is self-resonant at the Larmor frequency. The coil segment is without interconnection with other coil segments and is already resonant at the Larmor frequency that may be achieved in that the or each coil segment includes one or more components with complex resistance, that, in concert with the coil segment, generates resonance. Depending upon the interconnection, the components may, for example be a capacitor and/or an inductor. Waveguides with open short-circuited ends and an adapted length may be used, for example microstrip lines or coaxial cable sections.

The component or components to be part of the coupling element and, on connection to the coil segment, in each case may form a self-resonant element at the Larmor frequency of the magnetic resonance tomography unit.

The self-resonant coil segments also provide discretionary interconnections of the coil segments by the coupling elements to form coil windings with a different geometry, that are in each case in turn resonant at the Larmor frequency.

In an embodiment of the local coil matrix, the local coil matrix includes a multiplicity of coil segments. The coil segments span a two-dimensional network of polygons. The coil segments in each case form the sides of a triangle, quadrangle or hexagon, that are mechanically connected to form a closed network, that forms a two-dimensional area. In each case structures with the same topology, in which the connections between the corners or nodes are not straight but curved, may be considered to be triangles, quadrangles or hexagons. Networks of polygons with different numbers of sides may be used. A network includes hexagons because in each case only three coil segments meet in the node points so that the number of switches in the coupling element is reduced.

Not every node point may be occupied by coupling elements, but fixed connections may be provided in individual node points. Node points are the points of the network of polygons at which more than two coil segments meet. The coil segments at the nodes are electrically connected to one another in a manner that may not be changed by configuration, for example ohmically, by a capacitor or inductor. However, in the case of a multiplicity of nodes, a coupling element is provided that, depending upon the switching state, establishes another electrical connection between the coil segments at the node point. A multiplicity may be considered to more than 10%, 30%, 50% or 80% of the nodes in the network. The coupling element is configured to provide a detachable electrical connection for at least two of the coil segments adjacent to the node.

The coil segments may be assembled as two-dimensional flat structures that completely cover a surface, for example over a patient. The multiplicity of coupling elements provides different coil windings to be formed from the network of coil segments by configuration and thus to adapt the local coil matrix for different examinations in a flexible manner with respect to the coil size and shape.

In an embodiment of the local coil matrix, the local coil matrix includes a combination matrix with first signal terminals and second signal terminals and a controller. The controller is in signal connection with the combination matrix so that the controller of the combination matrix may transmit setting commands for the adjustable configuration of the combination matrix. The first signal terminals are in signal connection with the plurality of coil windings so that a magnetic resonance signal received from the coil winding is forwarded to the combination matrix. The combination matrix is configured to emit an output signal in a dependence adjustable by the controller by configuration commands on a multiplicity of input signals applied to first signal terminals at a second signal terminal. The signals at the first signal terminals may be added to form a group signal and the result is output at the second signal terminal. The signals may also first be subjected to weighting and/or phase shifting. Other linear or non-linear functions and relationships of the signals from the first signal terminals to form the signal at the second signal terminal are also possible.

The combination matrix makes it possible, in the case of subsampling or compressed sensing, to combine acquired signals in a different adjustable manner so that the different subsampled signals are already generated in the local coil and fewer connection lines to the receiver in the magnetic resonance tomography unit are required.

In an embodiment of the method for image acquisition with a magnetic resonance tomography unit with a local coil matrix, the local coil matrix includes a controller in signal connection with detuning elements or coil segments and coupling elements in signal connection with the controller.

In an act of the method, the magnetic resonance tomography unit transmits a first excitation pulse. The excitation pulse is configured to excite nuclear spins in an examination object in the magnetic resonance tomography unit. The excitation pulse may, for example, be transmitted via a body coil or also a local coil, for example the second coil windings of the local coil matrix. A first set of first coil windings is resonant at the frequency of the excitation pulse. This may, for example, be achieved by a configuration of the detuning elements with first coil windings or by closing coupling elements, that form a first or second coil winding from coil segments. Due to the resonance and the arrangement, the first coil windings may attenuate or amplify the B1 field generated by the excitation pulse. The effect and the strength depend on the resonance frequency of the first coil winding. The excitation may, controlled by the frequency, gradient fields and also the position of the selected transmit antennas, also only take place in specific regions of the patient.

In another act, the excited spins are phase-encoded by the gradient coils in order to impress a spatial position on the nuclear spins.

In a further act, magnetic resonance signals are received by a second set of first coil windings and/or second coil windings, for example, supplied individually or in combination to a receiver in the magnetic resonance tomography unit for further processing and image acquisition.

In another act, a second excitation pulse is emitted in order to excite nuclear spins. The excitation differs in that a third set of first coil windings is resonant at the frequency of the excitation pulse. The third set differs from the first set so that at least one of the first coil windings is in another state (resonant/non-resonant) compared to the first excitation. Nuclear spins may also be excited in another region of the patient by another z-gradient field. With this excitation, the different resonant first coil windings in the third set adapt the B1 shimming to another situation, for example another slice in the z-direction. However, due to the changed B1 shimming, there may be a response, for example, to a movement of the patient in the same region.

The second excitation is also followed in a further act by spatial encoding of spins by the gradient coils.

In a further act, magnetic resonance signals are received by a fourth set of first coil windings and/or second coil windings. The fourth set may be the same as the second set if magnetic resonance signals are to be received from the same region as with the preceding reception by a conventional method, i.e. without subsampling. However, another slice may be sampled in the z-direction. The reception may be performed with another combination of first coil windings and second coil windings with a different spatial sensitivity range in order to provide subsampled signals for image acquisition with compressed sensing.

Embodiments provide the provision of dynamic, spatially variable B1 shimming by the first coil windings.

The act of the reception of nuclear resonance signals may not directly follow the act of excitation and encoding. For acceleration, for example by a multi-slice method, several excitation and readout sequences may be temporally interleaved with one another so that, following the excitation of nuclear spins in a sub-region of the examination region, the readout first takes place in another sub-region of the examination region that has already been excited previously. The local coil matrix may be able in both the transmitting and receiving acts to change the selection of the coil winding and so in each case to use different and optimally adapted excitation and/or sensitivity patterns.

The local coil matrix provides a method for image acquisition that accelerates the image acquisition process and provides optimum image quality.

In an+ embodiment for image acquisition with a magnetic resonance tomography unit with a local coil matrix, the local coil matrix includes a controller in signal connection with detuning elements or coil segments and coupling elements in signal connection with the controller.

In one act, the magnetic resonance tomography unit emits a first excitation pulse. The excitation pulse is configured to excite nuclear spins in an examination object in the magnetic resonance tomography unit. The excitation pulse may, for example, be transmitted via a body coil or also via a local coil, for example with the first and/or second coil windings of the local coil matrix. The selection of the second coil windings for transmission is such that the nuclear spins are excited in at least one sensitivity range, hereinafter designated the second set of first coil windings.

In another act, the excited spins are phase-encoded by the gradient coils in order to impress a spatial position on the nuclear spins.

In a further act, magnetic resonance signals are received by a second set of first coil windings and/or second coil windings, i.e. supplied individually or in combination to a receiver in the magnetic resonance tomography unit for further processing and image acquisition.

In a further step, the magnetic resonance tomography unit transmits a second excitation pulse, for example, in exactly the same way as the transmission of the first excitation pulse. However, the transmission may take place with another spatial distribution by the selection of other first and/or second coil windings of the local coil matrix than with the first transmission so that the nuclear spins are excited in at least one sensitivity range, hereinafter referred to as a fourth set of first coil windings. This may reduce the mean SAR load.

In a further step of the method, the excited spins are phase encoded by the gradient coils in order to impress a spatial position on the nuclear spins.

In another act, magnetic resonance signals are received by a fourth set of first coil windings and/or second coil windings, i.e. supplied individually or in combination to a receiver in the magnetic resonance tomography unit for further processing and image acquisition. The second set is different from the fourth set and so the received signals have a different spatial sensitivity, in other words originate from a volume of the patient that differs, least in sub-regions, from a volume in the case of the previous reception with the second set.

Advantageously, the method provides subsampling of the examination region that includes spatial "diversity" i.e. samples the examination region with different sensitivity ranges, that may also include a different spatial extent. The set union of the sensitivity ranges of the set of coil windings used for the acquisition acquires or covers the entire surface of the examination region adjacent to the local coil matrix.

In an embodiment, the acts of transmission, encoding and receiving are repeated in each case with different second sets and fourth sets and an image of the examination region generated with the magnetic resonance tomography unit in dependence on the magnetic resonance signals received from the plurality of second sets and the fourth sets. The image generation may be performed with the aid of the method known as "compressed sensing".

The image reconstruction method "compressed sensing" may use the acquired data, that subsamples the examination region with different spatial sensitivity ranges, to provide an image with better quality in a shorter measuring time.

In an embodiment, the local coil matrix includes a combination matrix, that is in signal connection with the controller. In the receiving acts, the combination matrix in each case provides, driven by the controller, in dependence on the magnetic resonance signals of the second sets or the fourth sets of first coil windings and/or second coil windings selected to receive, output signals in a lower number than the number of coil windings in the second sets or fourth sets.

In other words, the number of signals is reduced by combination. If, for example, the number of coil windings in the second or fourth set is designated m, the combination matrix generates a number n of output signals, where m>n. With compressed sensing, n may equal 1.

This may, for example, be performed by imaging functions of m input variables on n output variables, such as linear combination or other mathematical imaging methods.

Since compressed sensing is based on subsampling, the number of input channels may be reduced. This is already performed in the local coil matrix by the combination matrix so that the number of connection lines to, and receive channels in, the magnetic resonance tomography unit may be reduced.

In an embodiment of the method with repeated receiving steps, second sets and fourth sets with in each case the same sensitivity ranges are repeated randomly without periodicity. For example, it may be the case that image acquisition requires more repetitions of excitation, encoding and readout or reception of the nuclear resonance signals than the number of combinations of first coil windings and second coil windings for second sets and fourth sets. A repetition of the readout/reception with the same second set or fourth set with the same sensitivity distribution or pattern is then unavoidable. Then, the repetition of the same patterns takes place not in a regular or periodic repetition pattern but in accordance with a temporally random repetition pattern.

Random repetition of the sensitivity pattern produces a better result when generating an image from the nuclear resonance signals by compressed sensing.

BRIEF DESCRIPTION OF THE FIGURES

FIG. 7 depicts a schematic of a coupling element of a local coil matrix according to an embodiment.

FIG. 8 depicts a schematic of switching configurations of the coupling element;

FIG. 13 depicts a schematic flow diagram of a method according to an embodiment.

FIG. 14 depicts a schematic flow diagram of a method according to an embodiment.

DETAILED DESCRIPTION

Figure 1:
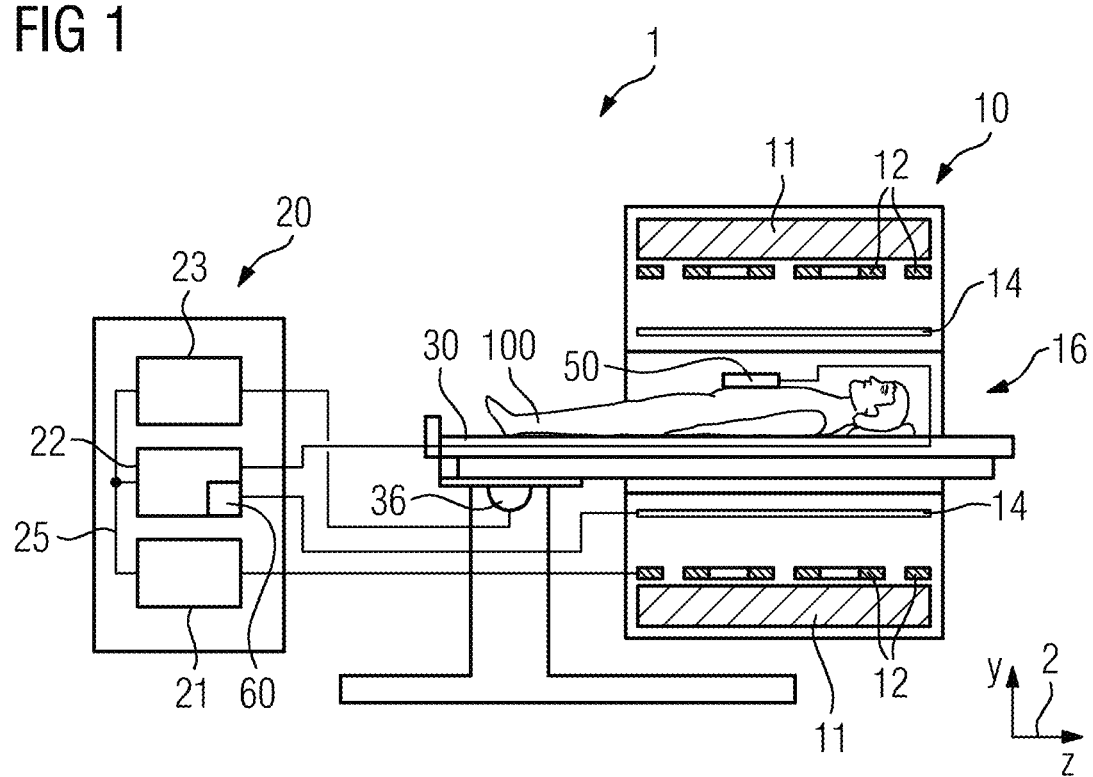
FIG. 1 depicts an example of a magnetic resonance tomography unit with a radio-frequency controller according to an embodiment.

FIG. 1 is a schematic depiction of an embodiment of a magnetic resonance tomography unit 1 with a local coil matrix 50.

The magnetic unit 10 includes a field magnet 11 that generates a static magnetic field B0 for the alignment of nuclear spins from samples or a patient 100 in a recording area. The recording area is arranged in a patient tunnel 16 that extends in a longitudinal direction 2 through the magnetic unit 10. A patient 100 may be moved into the recording area by the patient bench 30 and the moving unit 36 of the patient bench 30. The field magnet 11 may be a superconducting magnet able to provide magnetic fields with a magnetic flux density of up to 3 T, or even more, in the case of the latest devices. For lower field strengths, however, it is also possible to use permanent magnets or electromagnets with normally conducting coils.

The magnetic unit 10 also includes gradient coils 12 configured to superimpose variable magnetic fields in three spatial directions on the magnetic field B0 for spatial differentiation of image regions acquired in the examination volume. The gradient coils 12 may be coils made of normally conducting wires able to generate mutually orthogonal fields in the examination volume.

The magnetic unit 10 also includes a body coil 14 configured to irradiate a radio-frequency signal supplied via a signal line 33 into the examination volume and to receive resonance signals emitted by the patient 100 and output them via a signal line. However, the body coil 14 for the transmission of the radio-frequency signal and/or reception may be replaced by a local coil matrix 50 arranged in the patient tunnel 16 close to the patient 100. The local coil matrix 50 may be configured to transmit and receive, and hence a body coil 14 may be omitted.

A control unit 20 supplies the magnetic unit 10 with the different signals for the gradient coils 12 and the body coil 14 and evaluates the received signals. A magnetic resonance tomography unit controller 23 coordinates the sub-units.

The control unit 20 includes a gradient controller 21 configured to supply the gradient coils 12 with variable currents via supply lines that provide the desired gradient fields in the examination volume in a temporally coordinated manner.

The control unit 20 further includes a radio-frequency unit 22 that is configured to generate a radio-frequency pulse with a prespecified time sequence, amplitude and spectral power distribution for excitation of magnetic resonance of the nuclear spins in the patient 100. A pulse power in the kilowatt range may be achieved. The individual units are interconnected by a signal bus 25.

The radio-frequency signal generated by the radio-frequency unit 22 is supplied via a signal connection of the body coil 14 and emitted into the body of the patient 100 to excite the nuclear spins there. As described below with respect to FIG. 13, the coil windings of the local coil matrix 50 may perform temporally variable B1 shimming by resonant tuning. However, the high-frequency signal may be transmitted via one or more coil windings of the local coil matrix 50.

The local coil matrix 50 receives a magnetic resonance signal from the body of the patient 100 because, due to the short distance, the signal-to-noise ratio (SNR) of the local coil matrix 50 is better than with reception by the body coil 14. The MR signal received by the local coil matrix 50 is processed in the local coil matrix 50 and forwarded to the radio-frequency unit 22 of the magnetic resonance tomography unit 1 for evaluation and image acquisition. The signal connection 33 may be used, but, for example, wireless transmission is also possible.

Figure 2:
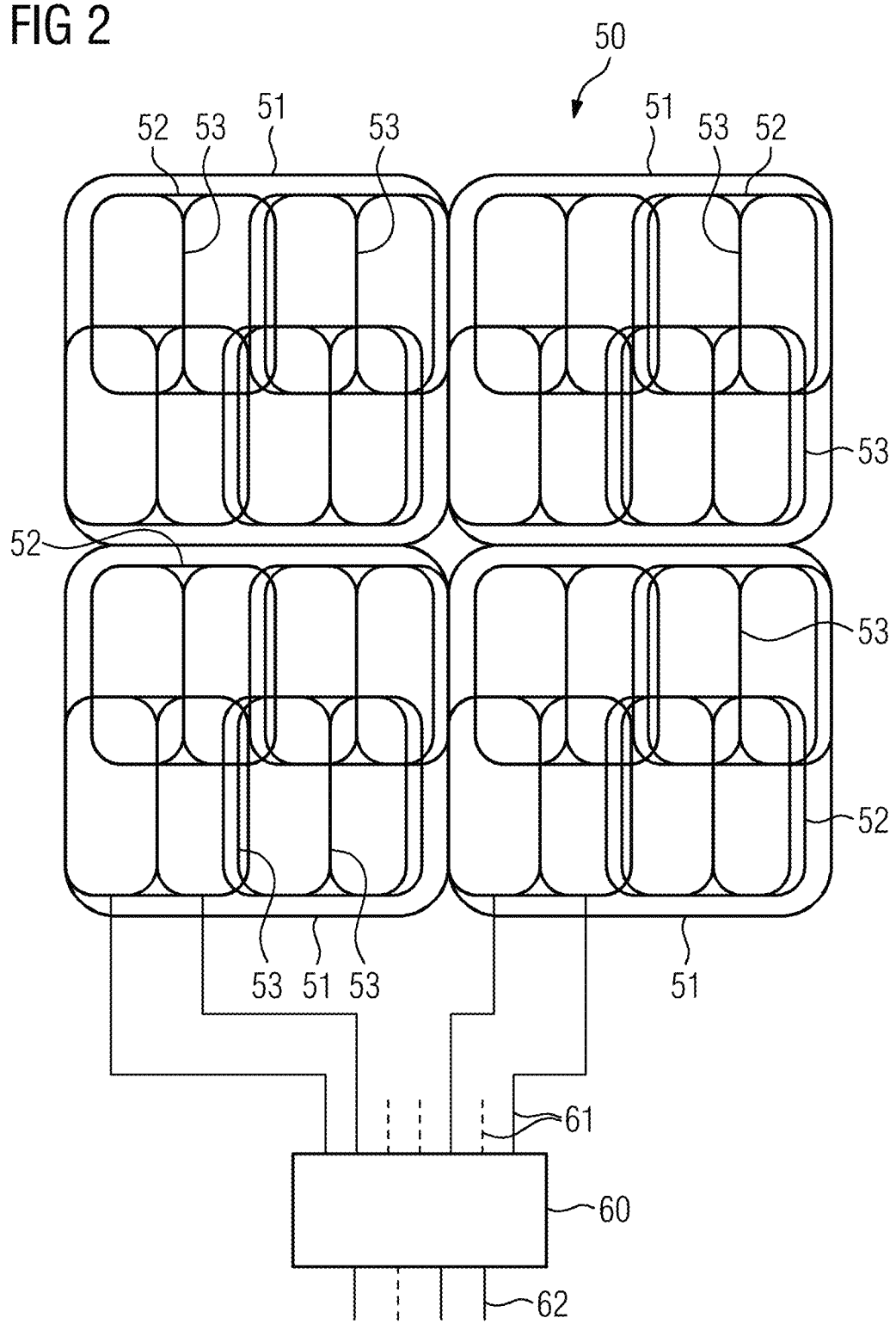
FIG. 2 depicts a schematic of coil windings of a first embodiment of a local coil matrix according to an embodiment.

FIG. 2 is a schematic depiction of an embodiment of the local coil matrix 50 with coil windings 51, 52, 53. The coil windings 51, 52 and 53 differ in the size of the area the coil windings 51, 52 and 53 enclose. The largest coil windings 51 in each case enclose an area, that is in turn also covered by the set union of the areas covered by the medium-size coil windings 52. With the enclosed area, a large coil winding 51 covers the same area as the enclosed areas of a plurality of medium-size coil windings 52 (in the example 2). 'Cover' may initially be understood in the figurative sense, but due to the geometric covering, the coils are sensitive to magnetic resonance signals within this area or the areas in a spatial region along a surface normal to the areas. Covering the area has the effect that a magnetic resonance signal from a source under the largest coil winding 51 may always be acquired by at least one of the medium-size coils 52 as long as its location along the surface normal is not so far from the enclosed areas that it may no longer be acquired by the medium-size coil winding 52. 'Acquire' may be considered to refer to a magnetic resonance signal that induces a voltage in a medium-size coil 52 generates a voltage in the largest coil winding 51 that is at most 3 dB, 6 dB or 12 dB higher.

The same also applies to the relationship between the smallest coil windings 53 and the medium-size coil windings 52 and the largest coil windings 51. In an embodiment, in each case 4 smallest coil windings 53 cover the same area as one medium-size coil winding 52 and 8 smallest coil windings 53 the area of one largest coil winding 51. At least for examination regions close to the local coil matrix 50, i.e. with a distance from the local coil matrix 50 that is less than the depth of the sensitivity range of the smallest coil winding 53, a magnetic resonance signal may be optionally acquired with a largest coil winding 51, a medium-size coil winding 52 or a smallest coil winding 53. In each case the coil winding with the smallest possible sensitivity range, i.e. also enclosed area, with which (due to the depth) the magnetic resonance signal may still be acquired is used for reception because this improves the signal-to-noise ratio. However, other applications are conceivable in which, for example, a large volume is only to be sampled quickly or with which different spatial sensitivity ranges are desirable.

In FIG. 2, in each case adjacent medium-size coil windings 52 and adjacent smallest coil windings 53 also overlap each other in the peripheral regions in order to decouple adjacent coil windings. However, the coil windings may be arranged of the same size disjointly in each case and achieve the decoupling with other measures, for example by decoupling capacitors.

A local coil matrix may only include two planes of coil windings of different sizes, for example only largest coil windings 51 and smallest coil windings 53, or further different size classes, where in each case at least 2 size classes, such as, for example, explained above with respect to the largest coil windings 51 and the medium-size coil windings 52 cover one another.

FIG. 2 also depicts a switching matrix 60 of the local coil matrix 50 that is in signal connection with each of the largest coil windings 51, the medium-size coil windings 52 and the smallest coil windings 53 at m first signal terminals 61. Not all signal connections are depicted in FIG. 2. There is a signal connection to the magnetic resonance tomography unit 1 at n second signal terminals 62, for example via cables or wirelessly. The switching matrix 60 is configured to be able to switch a signal connection from each of the m first signal terminals 61 at least with a second signal terminal 62. m>n so that the number of signal connections to the magnetic resonance tomography unit 1 is lower and only the signals of the coil windings currently required for acquisition are forwarded. The switches used in the switching matrix may, for example, be relays, transistors, PIN diodes or MEMS switches. The switching matrix 60 may not only route receive signals from the coil windings to receivers in the magnetic resonance tomography unit, but vice versa also routes transmit signals for the excitation of the nuclear spins from a transmitter in the magnetic resonance tomography unit 1 to the coil windings.

Figure 3:
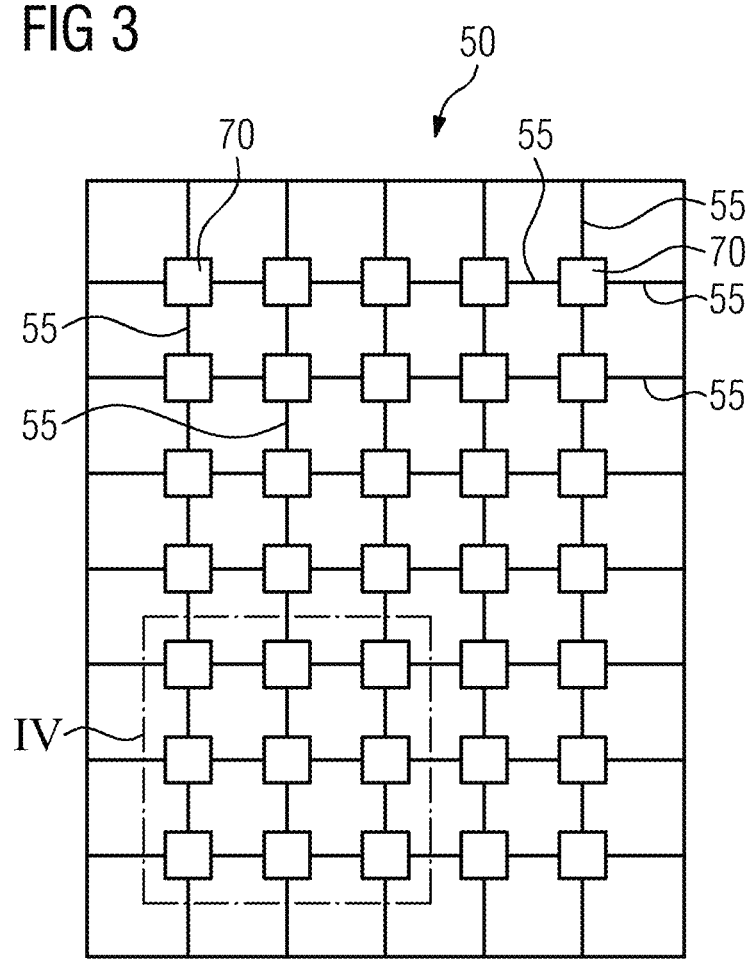
FIG. 3 depicts a schematic of a local coil matrix according to an embodiment.

FIG. 3 is a schematic depiction of another embodiment of a local coil matrix 50. This embodiment includes a multiplicity of coil segments 55 arranged in a grid. Coil segments 55 are considered to be electrical conductors with a longitudinal extension and that may be joined together by connecting by electrical connections to form a coil winding for radio-frequency signals with the Larmor frequency of the magnetic resonance tomography unit 1. The connections may, for example, be sections of highly conductive wires or radio-frequency litz wires but also strip conductors on flexible or rigid carrier materials for radio-frequency circuits. The carrier materials may include low dielectric losses. The conductors may be embedded in suitable insulating materials. Other conductors include exotic materials, such as superconductors, high-temperature conductors, carbon nanotubes or graphene.

The coil segments 55 are connected to one another by coupling elements 70 such that one or more coupling elements 70 are able to establish an electrically continuous conductor loop suitable for generating or receiving a magnetic resonance signal over a plurality of coil segments 55. To this end, the coupling elements 70 may, as explained below, include different types of controllable switching elements driven by a controller 80 via signal connections.

Figure 4:
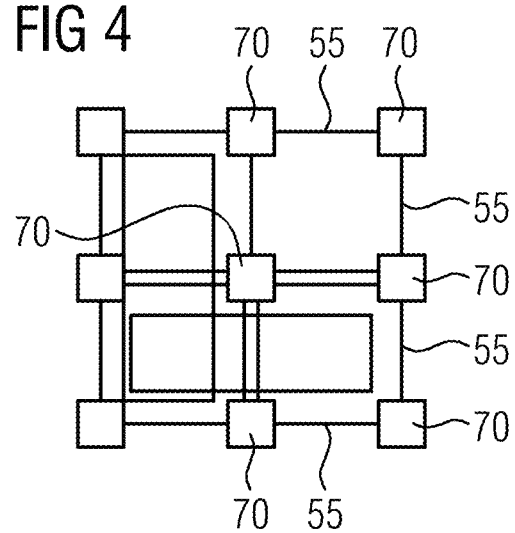
FIG. 4 depicts a schematic of configuration examples of a local coil matrix according to an embodiment.

FIG. 4 is a schematic depiction of configuration examples of the local coil matrix 50 such as may be achieved with different settings of the coupling elements 60. A suitable connection of the individual coil segments 55 by the coupling elements 60 may, for example, provide a coil winding with an upright shape indicated in the interior that includes the outer boundary of a rectangle formed by the two squares on the left to be switched. Likewise, a coil winding may, for example, be switched in the shape of a horizontal rectangle.

Also not shown in FIGS. 3 and 4 are signal connections via which the coil winding forwards receive signals to the magnetic resonance receiver or receives them from the receiver for transmission. The signal connections may either be connected directly to a plurality of coil segments 55, but the signal connections may also be provided on a plurality of coupling elements 70 so that the connections may be switched. Hence, the coupling elements 70 may simultaneously take on a function comparable to the switching matrix 60 in that the coupling elements 70 select one out of a plurality of adjacent coil segments provided for connection and in this way connect a conductor loop, in which the coil segment 55 and the coupling element 70 are integrated by configuration, in a controllable manner to the magnetic resonance tomography unit. In this way, the number of signal connections between the local coil matrix 50 and magnetic resonance tomography unit 1 may be kept lower than the number of the configurable coil windings of coupling elements 70 and coil segments 55 solely by the coupling elements. Examples of this are explained in more detail below.

Figure 5:
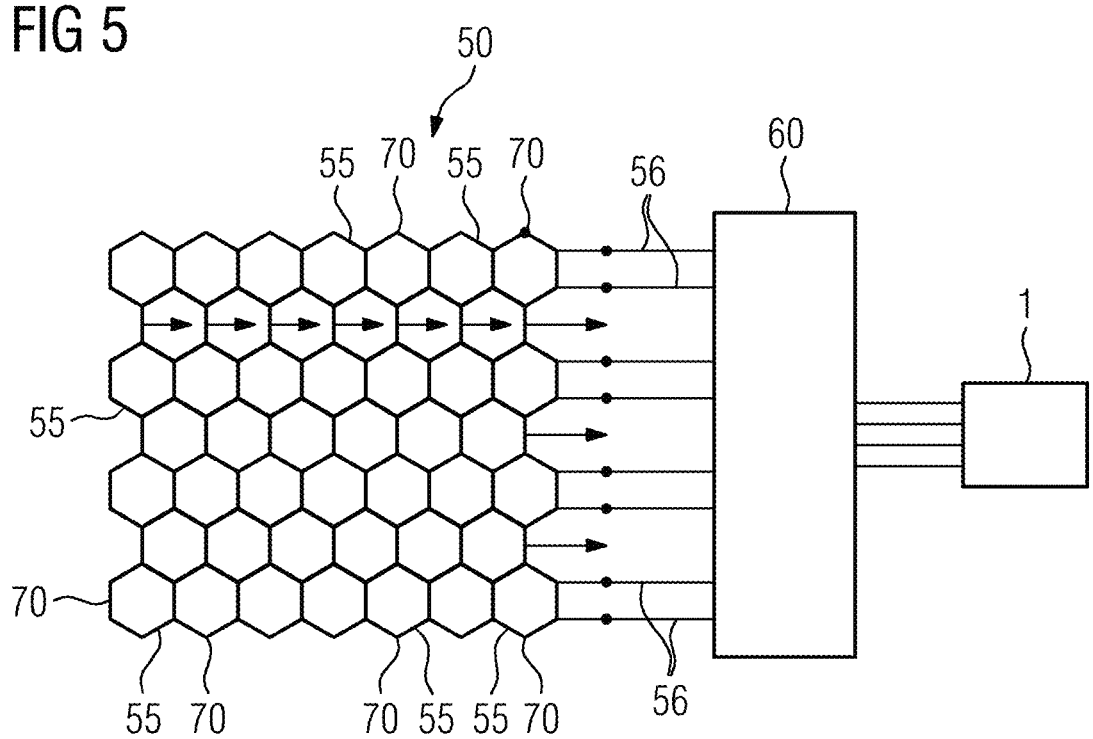
FIG. 5 depicts a schematic of a local coil matrix according to an embodiment.

FIG. 5 depicts a further embodiment of a local coil matrix. The local coil matrix 50 in FIG. 5 differs from the embodiment in FIG. 4 in that the coil segments 55 and coupling elements 70 do not form a grid with square basic elements but form a hexagonal grid. The main advantage of the hexagonal grid is that in each case only three coil segments 55 meet at each node. Therefore, a coupling element 70 arranged at a node requires a maximum of three switching elements, as depicted subsequently in FIG. 7 in order to be able to connect all coil segments 55 to each other flexibly. FIG. 5 further depicts a switching matrix 60 that in each case includes a signal connection 56 to two adjacent coupling elements 70.

The depicted signal connections 56 to the coupling elements 70 would, for example, provide the coil segments to be interconnected to form longitudinal coil windings and then connected via the switching matrix 60 so that coil windings are arranged in rows over the examination region and, for example, slice-wise sampling would be possible.

Figure 6:
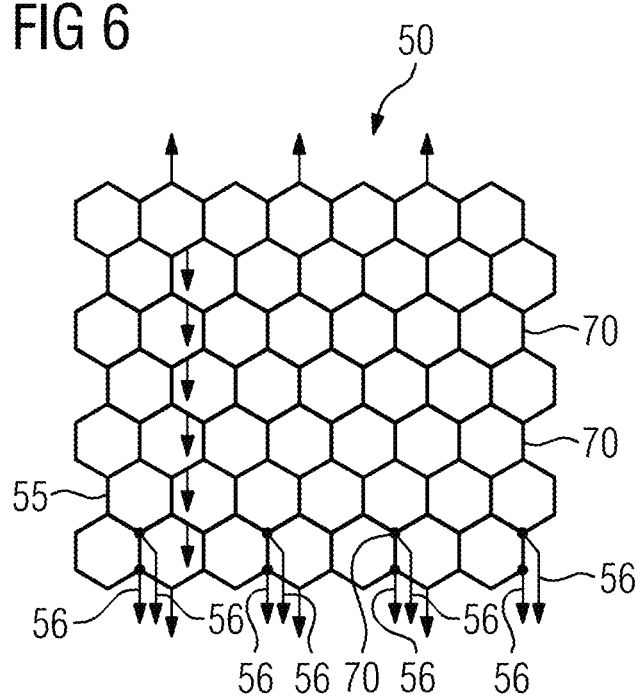
FIG. 6 depicts a schematic of a local coil matrix according to an embodiment.

FIG. 6 depicts a corresponding local coil matrix 50 with signal connections 56 that would provide sampling with coil windings in a longitudinal, vertical arrangement.

Also conceivable are hybrid forms with a vertical and horizontal connection to the edges of the local coil matrix 55. A flexible configuration provides an embodiment, that is not shown in further detail for reasons of clarity, with which the signal connections 56 are distributed in a flat manner between the switching matrix 60 and the coupling elements 70 over the local coil matrix. Not all, but only some, for example 50%, 30%, 10% or fewer, of the coupling elements 70 or coil segments 55 may be provided with a signal connection 56 to the switching matrix 60. The distribution may be uniform or in an arbitrary pattern. Such a distribution provides a magnetic resonance measurement to be performed over the area with differently-sized coil windings.

FIG. 7 depicts a coupling element 70 of a local coil matrix 50. The coupling element 70 is connected to three coil segments 55 between which the coupling element 70 may establish a connection by switching elements 71. However, other geometric configurations of the coupling matrix in which more than three coil segments 55 meet on a coupling element are also possible so that the coupling element 70 includes corresponding switching elements 71.

FIG. 7 does not depict a control line, by which the coupling element 70 or the switching elements 71 are controlled. The switches may be controlled directly by separate control lines by a voltage and/or a current, such as is, for example, possible with PIN diodes or transistors. However, because this requires numerous control lines that disrupt the alternating magnetic field, intelligent switching elements 71 may be used that provide a plurality of coupling elements or switching elements to be controlled via one or only a few lines. For example, a bus line may be used that connects a plurality or all coupling elements 70 to a controller of the magnetic resonance tomography unit and thus provides a configuration of the local coil matrix 50 for magnetic resonance imaging. The bus line might take over the energy supply and the control in that a DC or AC voltage modulates a control signal with addresses and control commands By separating the frequencies, the signal connection 56 may be used for the magnetic resonance signals for the energy supply and a control signal. Common usage of the signal connection 56 for control signals as well is possible if the magnetic resonance signal has already been digitized by an AD converter in the coupling element 70.

In the embodiment in FIG. 7, the switching elements 71 are in star-shaped signal connection at a common point from which the signal connection 56 to the switching matrix 60 and/or the magnetic resonance tomography unit 1 is also provided.

FIG. 8 depicts possible switching configurations of the coupling element 70 depicted in FIG. 7. The variants range from the opening of all switching elements 71 in G with which all the coil segments 55 provided are separate from one another, through the connection of an individual coil segment 55 to the signal connection 56 in F or a connection of two coil segments 55 to one another and to the signal connection 56 as in B, C and D, up to the connection of the all coil segments 55 provided to one another and to the signal connection 56 as in E.

Other coupling elements 70 may be used. For example, the three switching elements 71 may also be arranged in the sides of a triangle with corners connected to a coil segment in each case.

Figure 9:
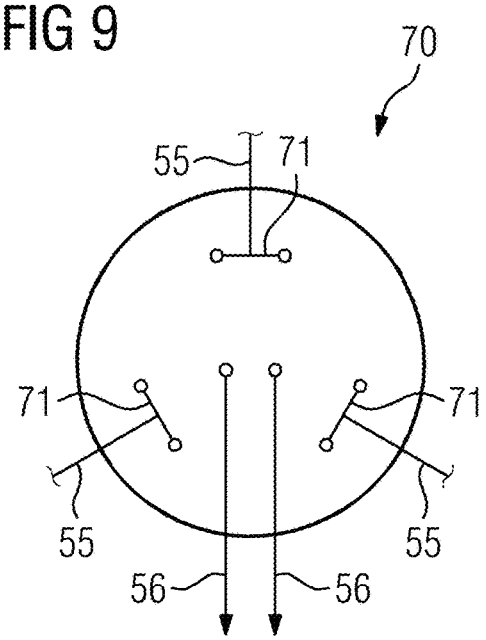
FIG. 9 depicts a schematic of a coupling element of a local coil matrix according to an embodiment.

FIG. 9 depicts a further possible embodiment of a coupling element 70. Each of the three each coil segments 55 connected to the coupling element 70 is provided with a switching element 71. The coupling element 70 further includes two independent signal connections 56 to the switching matrix 60 and/or the magnetic resonance tomography unit 1. With regard to the control of the switching elements 71, reference is made to the statements with respect to FIGS. 7 and 8.

Figure 10:
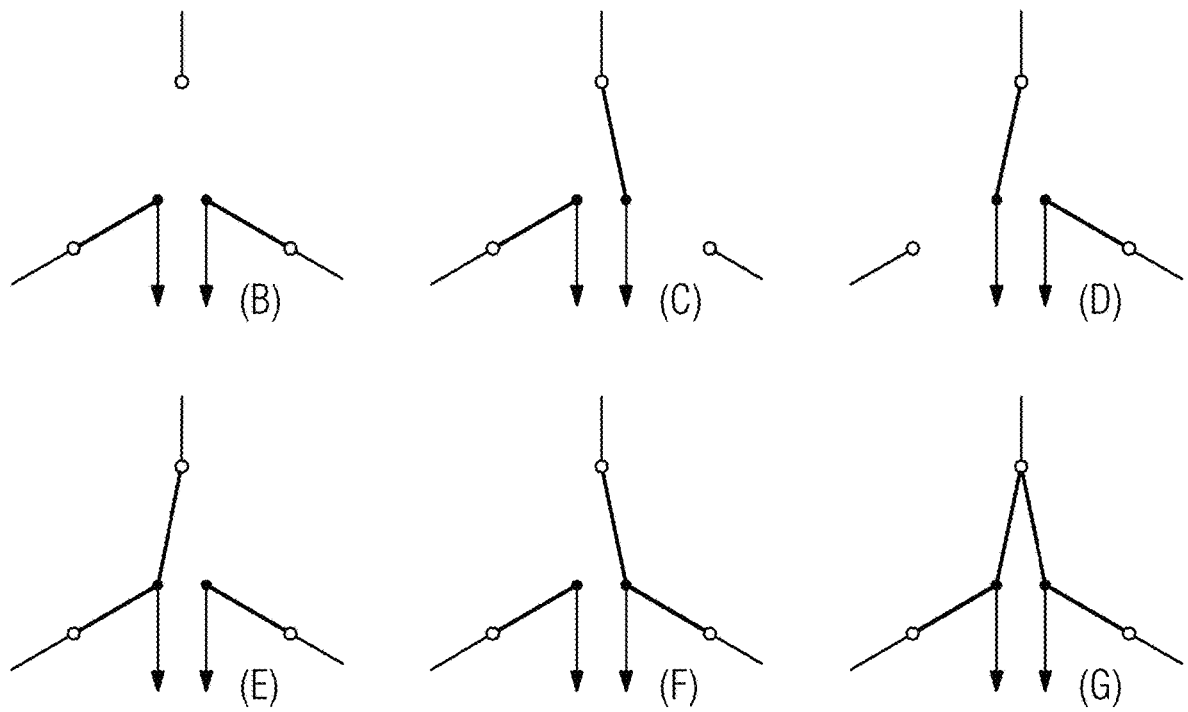
FIG. 10 depicts a schematic of switching configurations of the coupling element.

FIG. 10 depicts different possible switch settings of the switching elements 71 of the coupling element in FIG. 9. Compared to the coupling element 70 in FIGS. 7 and 8, due to the two signal connections 56, the coupling element 70 in FIGS. 9 and 10 enables the provision of two directly adjacent coil windings from the coil elements 55 provided in conjunction with other elements 70 and coil segments 55 and their connection to the magnetic resonance tomography unit 1.

The local coil matrices 50 in FIG. 3 to FIG. 10 also use different configuration of the coupling elements 70 to provide coil windings with different sensitivity ranges with which it is possible to use the same local coil matrix for optimum examinations of regions of the patient as different as the abdomen or wrist.

Figure 11:
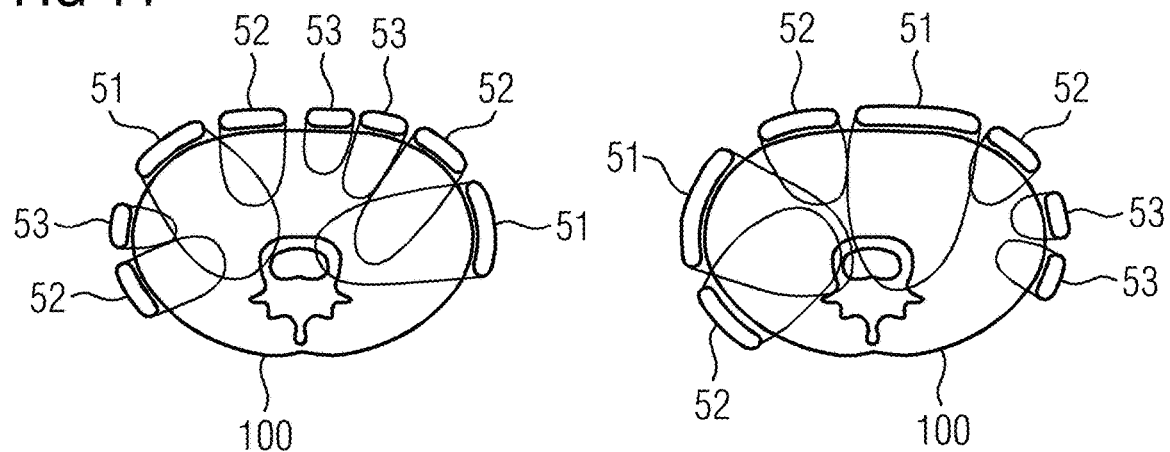
FIG. 11 depicts a schematic of sensitivity ranges of different configurations of the local coil matrix according to an embodiment on a patient.

FIG. 11 is a schematic depiction of sensitivity ranges of different configurations of the local coil matrix 50 on a patient 100. FIG. 11 depicts the coil windings that are active in the respective configuration. Three different sizes of coil windings are shown in this example: largest coil windings 51, medium-size coil windings 52 and smallest coil windings 53.

The coil windings may, for example, be provided as depicted in FIG. 2, by stacked, differently-sized coil windings, where in each case unused coil windings in the configuration are not depicted. The selection of the coil windings takes place, for example, via a switching matrix 60 or detuning appliances in the respective coil windings.

The coil windings may be formed by interconnecting the coil segments to form largest coil windings 51, medium-size coil windings 52 and smallest coil windings 53 with the aid of coupling elements 70, as depicted in detail in FIGS. 3 to 10.

FIG. 11 also depicts the sensitivity ranges of the respective coil windings that extend into the body of the patient 100. The sensitivity range of the largest coil windings 51 is the widest and deepest while the sensitivity range of the smallest coil windings 53 includes the smallest lateral extent. The sensitivity ranges substantially cover the entire body surface of the patient under the coils so that no gaps occur between the individual coil windings during the acquisition of the magnetic resonance signals or the excitation of the nuclear spins.

The two configurations in FIG. 11 have different sensitivity patterns, i.e. with the two configurations different sub-regions of the examination region in the body of the patient 100 are acquired by different coil windings with a different sensitivity range. For example, in the case of data acquisition for imaging, each sub-region may be acquired at least once by two different coil windings with different sensitivity ranges. The acquisition with different sensitivity ranges is also called "diversity".

Image reconstruction with "compressed sensing" benefits from the spatial "diversity" and provides acceleration of the image acquisition by a lower sum total of readout cycles by up to a factor 10. A number of coil sensitivity profiles (CP2, CP4, CP6) are switched in a random repeat pattern for their readout time (RO1, RO2 . . . ) and in a repetition period TR.

Figure 12:
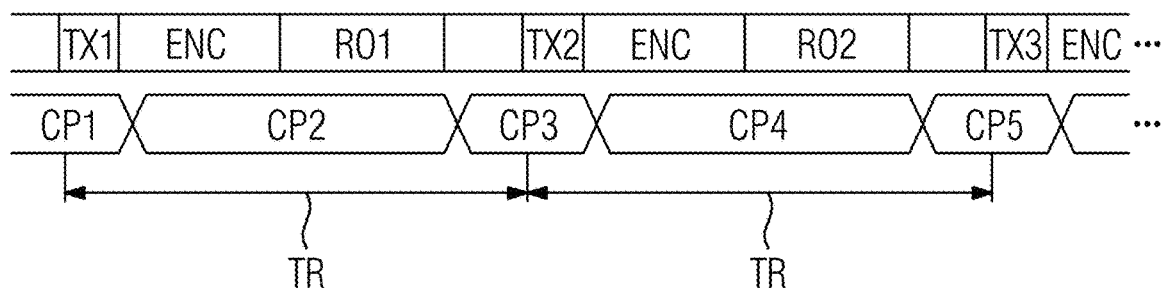
FIG. 12 depicts a temporal sequence of a magnetic resonance measurement by the method according to an embodiment.

FIG. 12 depicts a plurality of readout cycles in the temporal sequence. Plotted on the right is the time, that is divided into individual pulse trains or readout cycles, that are repeated with a period TR. A new readout cycle begins with an excitation pulse denoted TX1, TX2 or TX3 for excitation of the nuclear spins in the examination region in the body of the patient and is followed by encoding, that may be controlled by a magnetic field gradient of the gradient coils and impresses a spatial phase assignment on the nuclear spins within a slice or volume. The magnetic resonance signals, that emit the nuclear spins over the period designated RO1, RO2, are read out in that the radio frequency is received by a coil winding and recorded with amplitude and phase information. With a multi-slice method, different slices may include different Larmor frequencies due to a gradient and so may be read out separately of one another. Thus, it is, for example, the magnetic resonance signals of the nuclear spins excited with TX1 are received in RO2 that provides pauses within a readout cycle to be exploited in that magnetic resonance signals of another slice are received. Such pauses may, for example, be necessary due to relaxation of the nuclear spins. CP1, CP2, CP3, CP4 and CP5 indicate different configurations of the local coil matrix with different sensitivity profiles, that may be adapted and optimized individually for each excitation pulse and each readout.

In an act S110 of the method in FIG. 13, a first excitation pulse is transmitted. A first set of first coil windings is resonant at the frequency of the excitation pulse. Resonance may, for example, be affected by setting detuning elements or by interconnecting a correspondingly localized coil winding formed of individual coil segments by the coupling elements. The excitation pulse may, for example, be transmitted from the radio-frequency unit 22 of the magnetic resonance tomography unit 1 via the body coil 14, a local transmit coil or also via coil windings of the local coil matrix 50 that corresponds, for example, to the section TX1 in FIG. 12. The resonant coil windings modify the B1 field of the excitation pulse in their environment and provide, for example, selective compensation of local inhomogeneities in the excitation of the nuclear spins. The effect achieved is also called B1 shimming.

In an act S120, the excited nuclear spins are encoded by the gradient controller 21 and the field gradients generated by the gradient coils 12.

In an act S130, magnetic resonance signals are received by a second set of first coil windings and/or second coil windings. In FIG. 12, this corresponds to the time slot RO1. The signal may originate from the nuclear spins excited in TX1. Magnetic resonance signals may also be received in RX1 that have already been excited in an excitation phase before TX1 in another sub-region of the examination region. Accordingly, the second set of coil windings is selected for example such that their sensitivity range corresponds to an excitation range of the associated excitation pulse. If nuclear spins that were excited in TX1 are read out in RO1, the configuration of the local coil matrix 50 may possibly remain the same. However, if nuclear spins that were excited before TX1 are read out in RO1, the local coil matrix is brought into a configuration with a sensitivity corresponding to the excitation distribution during the corresponding excitation pulse. Thus, the best signal may be achieved in each case by the configured coil windings. The signals from the coil windings may then be transmitted individually or in combination with other signals after preamplification and optionally digitization and/or frequency conversion to the magnetic resonance tomography unit 1 for evaluation via a cable connection or wirelessly.

In an act S140, a second excitation pulse is emitted by the radio-frequency unit, as described for S110. The difference from act S110 is that a third set of first coil windings is resonant at the frequency of the excitation pulse. Among a multiplicity of excitation pulses, the third set of resonant coil windings differs from the first set of resonant coil windings configured with previous excitation pulses at least during one excitation pulse, but with a multiplicity of excitation pulses. For example, with a multislice method, the set of resonant coil windings may be different for every slice.

In an act S150, the spins excited in S140 are encoded as described above by the gradient coils 12, only the gradients are optionally configured to a changed excitation range, that, for example, may be in another slice.

In an act S160, magnetic resonance signals are received by a fourth set of first coil windings and/or second coil windings. The explanations given with respect to S130 also apply here; only the fourth set of coil windings differ from the second set of coil windings.

Due to the flexible configurability of the local coil matrix, the method in FIG. 13 provides a rapid change in the radio-frequency characteristics and hence optimization of the excitation even for individual single pulses in image acquisition.

FIG. 14 depicts an embodiment of a method that provides an example of how the properties of the local coil matrix 50 may be used at the receiving end and subsequently in the image reconstruction. The method in FIG. 14 may also be combined with the method in FIG. 13 in that the special properties of the local coil matrix are applied during excitation.

In an act S210, a first excitation pulse is transmitted. This may take place as described with respect to S110 in FIG. 13 or even without resonant adjustment of local coils, for example with a body coil 14.

In an act 220 the nuclear spins are encoded by gradient coils, as already described with respect to S120.

In an act S230, magnetic resonance signals are received by a second set of first coil windings and/or second coil windings. The statements made with respect to S130 also apply here. However, the sensitivity ranges of at least some of the coil windings in the examination region are of different sizes or the volume is of a different size, as depicted, for example, on the left side of FIG. 11. As a result, the data received in step S230 have an inherent spatial "diversity" that is subsequently advantageous for image reconstruction by "compressed sensing".

In an act S240, a second excitation pulse is transmitted. This may take place as described with respect to S210 or also in accordance with the description with respect to S140 in FIG. 13 if excitation is to be optimized.

In an act 250, the nuclear spins are encoded by gradient coils 12, as already described with respect to S120, S150 and S220.

In an act S260, magnetic resonance signals are received by a fourth set of first coil windings and/or second coil windings. This act is distinguished from S160 in that the second set is different from the fourth set. The second set and the fourth set differ at least in a first or second coil winding so that the sensitivity ranges of the two sets are different. The difference relates not only to different set unions of all sensitivity ranges of the coil windings in the fourth set, but it is sufficient if a sub-region of another coil winding with a different sensitivity range than in the second set is acquired. An example may be seen in FIG. 11, where the depiction on the left depicts, for example, the second set of coil windings and the depiction on the right depicts the fourth set of coil windings.

In an act S270, the magnetic resonance tomography unit checks whether sufficient magnetic resonance signals for image reconstruction have been acquired. If not, the steps of the transmission (S210, 240), encoding (S220, S250) and receiving (S230, S260) are repeated in each case with different second sets and fourth sets.

If sufficient data for image reconstruction has been acquired, in an act S280, the magnetic resonance tomography unit 1 or also an external computer generates an image in dependence on the magnetic resonance signals received by the plurality of second sets and the fourth sets. Due to "diversity" of the magnetic resonance signals acquired and the reconstruction method used, a sufficient set may be smaller by up to a factor of 10 than in the case of conventional image reconstruction. With the local coil matrix for signal acquisition, compressed sensing may be used for image reconstruction.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil matrix for image acquisition with a magnetic resonance tomography unit, the local coil matrix comprising:
a plurality of coil windings comprising a plurality of first coil windings and a plurality of second coil windings, wherein each second coil winding of the plurality of second coil windings surrounds first coil windings of the plurality of first coil windings and wherein a sensitivity range of the first coil windings surrounded by the respective second coil winding is a subset of the second sensitivity range of the respective second coil winding;
wherein the local coil matrix is configured, during magnetic resonance imaging, to acquire, excite, or acquire and excite a predetermined region of a patient arranged in the vicinity of the local coil matrix with selectable differently sized sensitivity ranges.

2. A method for image acquisition with a magnetic resonance tomography unit with a local coil matrix, the method comprising:
transmitting a first excitation pulse;
encoding spins by gradient coils;
receiving magnetic resonance signals by a second set of first coil windings, second coil windings, or first coil windings and second coil windings;
transmitting a second excitation pulse;
encoding the spins by the gradient coils; and
receiving magnetic resonance signals by a fourth set of first coil windings, second coil windings, or first coil windings and second coil windings;
repeating the transmitting of the first excitation pulse, the transmitting of the second excitation pulse, the encoding of the spins by the gradient coils twice, and the receiving of the magnetic resonance signals with a different second set of first coil windings, second coil windings, or first coil windings and second coil windings and a different fourth set of first coil windings, second coil windings, or first coil windings and second coil windings; and
generating an image in dependence on the magnetic resonance signals received from the second sets and the fourth sets;
wherein the second set of first coil windings, second coil windings, or first coil windings and second coil windings is different than the fourth set of first coil windings, second coil windings, or first coil windings and second coil windings.

3. A local coil matrix for image acquisition with a magnetic resonance tomography unit, the local coil matrix comprising:
a plurality of coil windings;
at least one coupling element;
a plurality of coil segments; and
a controller in signal connection with the at least one coupling element;
wherein the local coil matrix is configured, during magnetic resonance imaging, to acquire, excite, or acquire and excite a predetermined region of a patient arranged in the vicinity of the local coil matrix with selectable differently sized sensitivity ranges;
wherein each coupling element of the at least one coupling element is in signal connection with at least two coil segments of a coil winding of the plurality of coil windings,
wherein the controller is configured to interconnect the at least two coil segments to a first coil winding of the plurality of coil windings and to a second coil winding of the plurality of coil windings, the interconnection of the at least two coil segments to the first coil winding comprising activation of a first switching state of the at least one coupling element and the interconnection of the at least two coil segments to the second coil winding comprising activation of a second switching state of the at least one coupling element, and
wherein the first coil winding includes a smaller enclosed area than the second coil winding.

4. The local coil matrix of claim 1, further comprising a controller,
wherein the plurality of first coil windings comprise detuning elements in signal connection with the controller.

5. The local coil matrix of claim 1, further comprising:
at least one coupling element;
a plurality of coil segments; and
a controller in signal connection with the at least one coupling element,
wherein each coupling element of the at least one coupling element is in signal connection with at least two coil segments of a coil winding of the plurality of coil windings,
wherein the controller is configured to interconnect the at least two coil segments to a first coil winding of the plurality of coil windings and to a second coil winding of the plurality of coil windings, the interconnection of the at least two coil segments to the first coil winding comprising activation of a first switching state of the at least one coupling element and the interconnection of the at least two coil segments to the second coil winding comprising activation of a second switching state of the at least one coupling element, and
wherein the first coil winding includes a smaller enclosed area than the second coil winding.

6. The local coil matrix as of claim 1, further comprising:
a combination matrix comprising first signal terminals and second signal terminals; and
a controller in signal connection with the combination matrix,
wherein the first signal terminals are in signal connection with the plurality of coil windings, and
wherein the combination matrix is configured to emit an output signal in dependence on a plurality of input signals applied to the first signal terminals adjustable by the controller at a second signal terminal of the second signal terminal.

7. The local coil matrix of claim 1, wherein the local coil matrix is configured to:
transmit a first excitation pulse, wherein a first set of the plurality of first coil windings is resonant at a frequency of the first excitation pulse;
encode spins by gradient coils;
receive magnetic resonance signals by a second set of the plurality of first coil windings, the plurality of second coil windings, or the plurality of first coil windings and the plurality of second coil windings;
transmit a second excitation pulse, wherein a third set of the plurality of first coil windings is resonant at a frequency of the first excitation pulse;
encode the spins by the gradient coils; and
receive magnetic resonance signals by a fourth set of the plurality of first coil windings, the plurality of second coil windings, or the plurality of first coil windings and the plurality of second coil windings, wherein the first set of the plurality of first coil windings is different than the third set of the plurality of first coil windings.

8. The local coil matrix of claim 7, wherein the second set of first coil windings, second coil windings, or first coil windings and second coil windings is different than the fourth set of first coil windings, second coil windings, or first coil windings and second coil windings.

9. The method of claim 2, wherein a set union of sensitivity ranges of the second set of first coil windings, second coil windings, or first coil windings and second coil windings and a set union of sensitivity ranges of the fourth set of first coil windings, second coil windings, or first coil windings and second coil windings substantially cover a surface of an examination region.

10. The method of claim 2, wherein receiving magnetic resonance signals by a second set of first coil windings, second coil windings, or first coil windings and second coil windings and receiving magnetic resonance signals by a fourth set of first coil windings, second coil windings, or first coil windings and second coil windings each comprises providing, by a combination matrix, dependent on the magnetic resonance of the second set or the fourth set output signals, and wherein a number of the respective output signals is smaller than a number of coil windings in the second set or the fourth set.

11. The method of claim 2, wherein the generating of the image comprises using a compressed sensing method.

12. The method of claim 2, wherein the repeating the receiving of the magnetic resonance signals with a different second set of first coil windings, second coil windings, or first coil windings and second coil windings and a different fourth set of first coil windings, second coil windings, or first coil windings and second coil windings comprises using second sets and fourth sets with equal sensitivity ranges repeated randomly without periodicity.

13. The local coil matrix of claim 3, wherein the plurality of coil segments are self-resonant at the Larmor frequency.

14. The local coil matrix of claim 3, wherein the plurality of coil segments span a two-dimensional network of polygons.

* * * * *